(12) United States Patent
Okazaki

(10) Patent No.: US 6,764,183 B2
(45) Date of Patent: Jul. 20, 2004

(54) COLOR LASER DISPLAY EMPLOYING EXCITATION SOLID LASER UNIT, FIBER LASER UNIT, OR SEMI CONDUCTOR LASER UNIT

(75) Inventor: Yoji Okazaki, Kaisei-machi (JP)

(73) Assignee: Fuji Photo Film Co., Ltd., Kanagawa-ken (JP)

(*) Notice: Subject to any disclaimer, the term of this patent is extended or adjusted under 35 U.S.C. 154(b) by 0 days.

(21) Appl. No.: 09/805,833

(22) Filed: Mar. 14, 2001

(65) Prior Publication Data

US 2001/0022566 A1 Sep. 20, 2001

(30) Foreign Application Priority Data

Mar. 16, 2000 (JP) ........................................ 2000-073234

(51) Int. Cl.[7] .................. G03B 21/00; H01S 3/091; G09F 13/00; G02B 23/00; G02B 26/08
(52) U.S. Cl. ........................ 353/31; 372/75; 362/75; 359/430; 359/204
(58) Field of Search .................... 353/31; 372/75; 362/551; 359/430, 204

(56) References Cited

U.S. PATENT DOCUMENTS

| | | | | |
|---|---|---|---|---|
| 5,309,452 A | * | 5/1994 | Ohishi et al. ................. | 372/6 |
| 5,317,348 A | * | 5/1994 | Knize ......................... | 348/750 |
| 5,727,007 A | * | 3/1998 | Smart et al. .................. | 372/6 |
| 5,727,016 A | * | 3/1998 | Paxton ........................ | 372/45 |
| 5,796,771 A | * | 8/1998 | DenBaars et al. .............. | 372/43 |
| 5,920,361 A | * | 7/1999 | Gibeau et al. ................ | 348/750 |
| 6,015,979 A | * | 1/2000 | Sugiura et al. ............... | 257/103 |
| 6,125,132 A | * | 9/2000 | Okazaki ....................... | 372/75 |
| 6,255,669 B1 | * | 7/2001 | Birkhahn et al. .............. | 257/102 |
| 6,277,664 B1 | * | 8/2001 | Lozykowski et al. ........... | 438/22 |
| 6,490,309 B1 | * | 12/2002 | Okazaki et al. ............... | 372/75 |
| 6,594,090 B2 | * | 7/2003 | Kruschwitz et al. ............ | 359/707 |
| 2002/0122260 A1 | * | 9/2002 | Okazaki et al. ............... | 359/636 |

OTHER PUBLICATIONS

Laser Focus World, May 1998, pp. 242–251.

* cited by examiner

Primary Examiner—Russell Adams
Assistant Examiner—Magda Cruz
(74) Attorney, Agent, or Firm—Stroock & Stroock & Lavan LLP

(57) ABSTRACT

Disclosed herein is a color laser display that comprises a red laser light source for emitting red laser light, a green laser light source for emitting green laser light, and a blue laser light source for emitting blue laser light. An excitation solid laser unit (which has a solid-state laser crystal doped with $Pr^{3+}$ and a GaN semiconductor laser element for exciting the solid-state laser crystal), a fiber laser unit (which has a fiber with a $Pr^{3+}$-doped core and a GaN semiconductor laser element for exciting the fiber), or a semiconductor laser unit (which has a semiconductor laser element, employing a GaN semiconductor, and a surface-emitting semiconductor element), is employed as at least one of the red laser light source, the green laser light source, or the blue laser light source.

14 Claims, 10 Drawing Sheets

F I G . 4
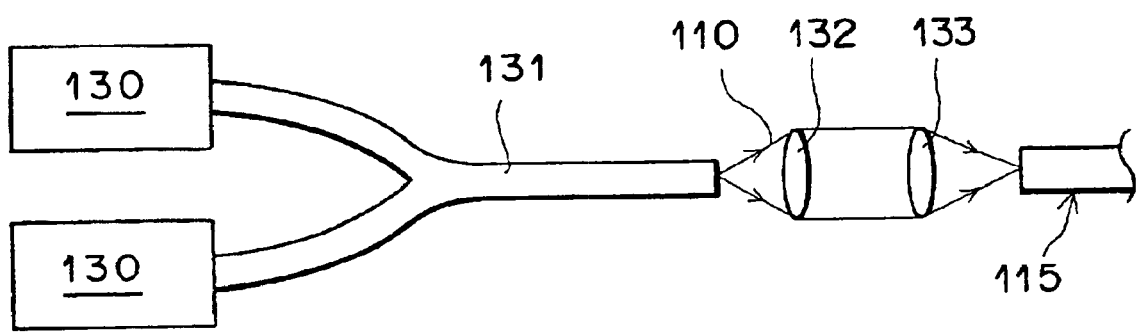

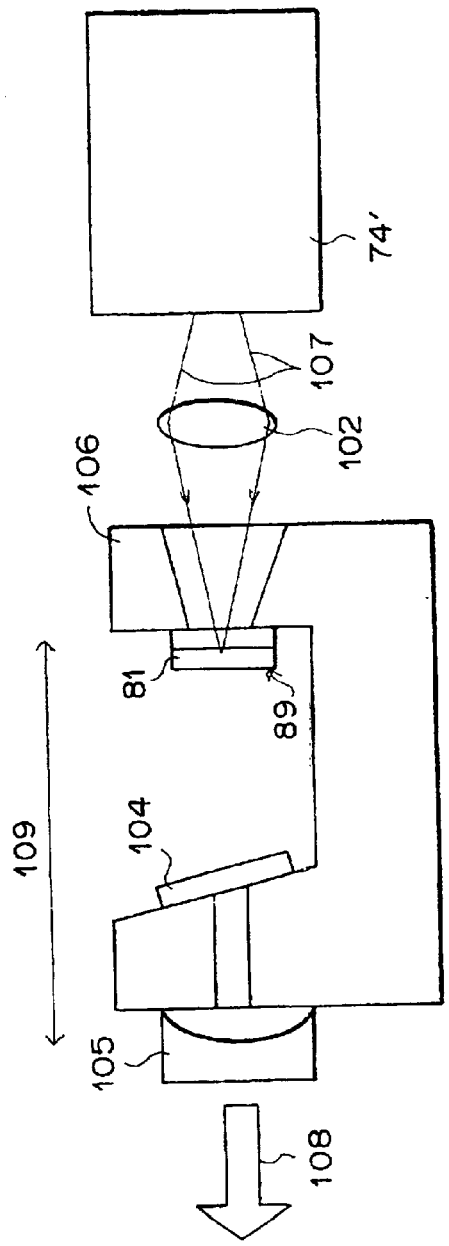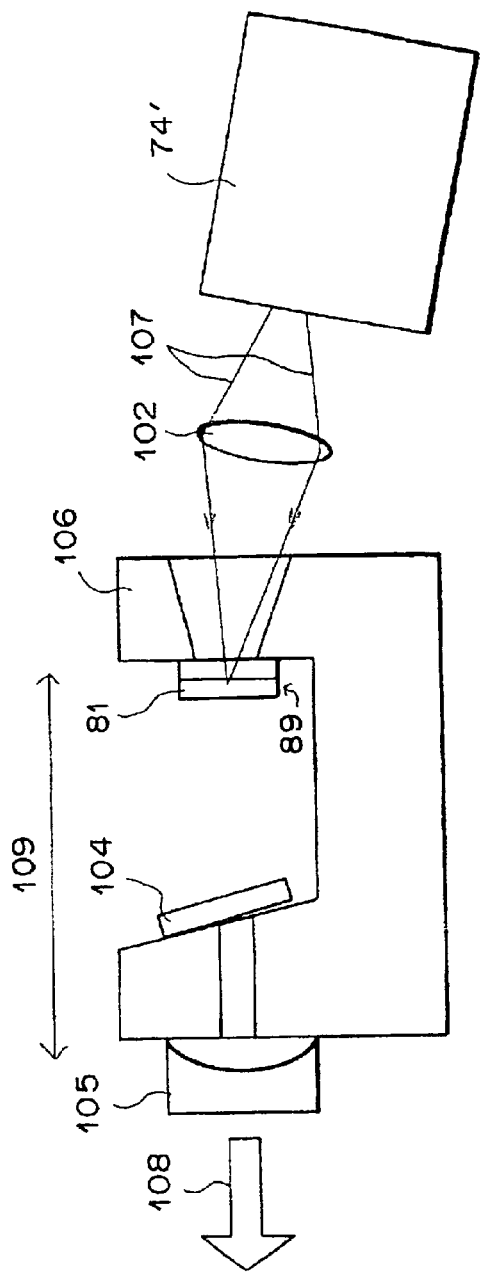
FIG. 8A
FIG. 8B

F I G . 10
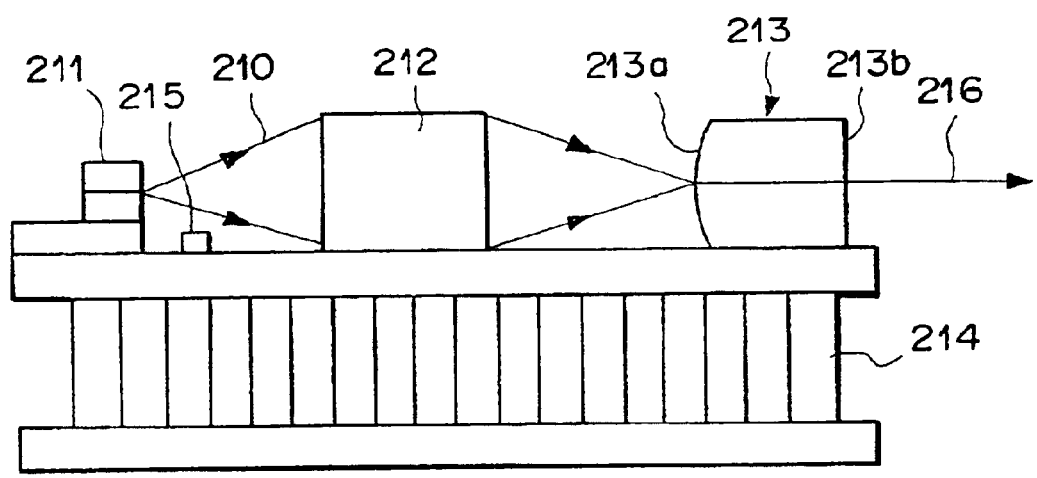

COLOR LASER DISPLAY EMPLOYING EXCITATION SOLID LASER UNIT, FIBER LASER UNIT, OR SEMI CONDUCTOR LASER UNIT

BACKGROUND OF THE INVENTION

1. Field of the Invention

The present invention relates generally to a color laser display of a type where a screen is scanned with three-color laser light, and more particularly to a color laser display in which an excitation solid laser unit with a $Pr^{3+}$-doped solid-state laser crystal, or a fiber laser unit with a fiber having a $Pr^{3+}$-doped core, or a semiconductor laser unit with a GaN semiconductor laser element for exciting a surface-emitting semiconductor element, is employed as a laser light source.

2. Description of the Related Art

There is a conventional color laser display in which an image is projected onto a screen, which displays each color when irradiated with red, green, and blue light, by scanning the screen with laser light modulated based on each color image signal. In another conventional color laser display, an image obtained by modulating laser light with a spatial modulation element is projected onto a screen by a projection optics system. These types of color laser displays require a laser light source, whose output is of the order of W (watt), in order to meet the high-brightness requirement. Because of this, a high-output gas laser, such as an $Ar^+$ gas laser, a $Kr^+$ gas laser, etc., has been used as the laser light source. However, the gas laser has the disadvantage that its device size is increased and manufacturing costs are considerably high, because the energy conversion efficiency is low such as about 0.1% and a cooling mechanism is necessary.

Hence, excitation second-harmonic-generation (SHG) solid lasers have recently been used as visible short-wavelength laser light sources, as described in Jpn. J. Laser Focus World, p.52 (December 1997). For instance, an yttrium aluminum garnet (YAG) laser unit, which employs an excitation solid laser element of oscillating wavelength 1064 nm to emit laser light of green wavelength 532 nm, is higher in energy conversion efficiency than the aforementioned gas laser.

However, noise due to a conflict of longitudinal modes will occur as the aforementioned excitation SHG laser unit generates higher output. For example, Jpn. J. Laser Focus World (p 243, May 1998) discloses that an amount of noise due to the blue and green solid laser elements is 3% or less, while an amount of noise due to the red solid laser element is as much as 50%.

To control these longitudinal modes, it is conceivable to insert, for example, an etalon as a wavelength selecting element. However, in such a case, realization of perfect single mode oscillation results in a great loss in efficiency, and consequently, high output is no longer obtainable and there arises a problem that the laser display will not able to have high brightness. Thus, in the case of employing the excitation SHG solid laser unit as a light source for a laser display, a reduction in the size is attainable, but numerous problems remain unsolved with respect to high efficiency, device performance, and costs.

SUMMARY OF THE INVENTION

The present invention has been made in view of the problems found in the prior art. Accordingly, it is the primary object of the present invention to provide a color laser display that is capable of realizing size reduction, high efficiency, and noise reduction.

To achieve this end and in accordance with an important aspect of the present invention, there is provided a first color laser display comprising:

a red laser light source for emitting red laser light;

a green laser light source for emitting green laser light;

a blue laser light source for emitting blue laser light;

modulation means for modulating the red laser light, the green laser light, and the blue laser light, based on a red image signal, a green image signal, and a blue image signal;

a screen for displaying red, green, and blue when irradiated with the red laser light, the green laser light, and the blue laser light; and projection means for projecting the red laser light, the green laser light, and the blue laser light onto the screen so that an image, carrying the red, green, and blue image signals, is displayed on the screen;

wherein an excitation solid laser unit, having a solid-state laser crystal doped with $Pr^{3+}$ and a GaN semiconductor laser element for exciting the solid-state laser crystal, is employed as at least one of the red laser light source, the green laser light source, or the blue laser light source.

In the first color laser display, the excitation solid laser unit may emit laser light of wavelength 600 to 660 nm by a transition of $^3P_0 \rightarrow {}^3F_2$ or $^3P_0 \rightarrow {}^3H_6$, and this laser unit can be satisfactorily employed as the red laser light source. The excitation solid laser unit may also emit laser light of wavelength 515 to 555 nm by a transition of $^3P_1 \rightarrow {}^3H_5$, and this laser unit can be satisfactorily employed as the green laser light source. Furthermore, the excitation solid laser unit may emit laser light of wavelength 465 to 495 nm by a transition of $^3P_0 \rightarrow {}^3H_4$, and this laser unit can be satisfactorily employed as the blue laser light source.

In accordance with another important aspect of the present invention, there is provided a second color laser display comprising:

a red laser light source for emitting red laser light;

a green laser light source for emitting green laser light;

a blue laser light source for emitting blue laser light;

modulation means for modulating the red laser light, the green laser light, and the blue laser light, based on a red image signal, a green image signal, and a blue image signal;

a screen for displaying red, green, and blue when irradiated with the red laser light, the green laser light, and the blue laser light; and projection means for projecting the red laser light, the green laser light, and the blue laser light onto the screen so that an image, carrying the red, green, and blue image signals, is displayed on the screen;

wherein a fiber laser unit, having a fiber with a $Pr^{3+}$-doped core and a GaN semiconductor laser element for exciting the fiber, is employed as at least one of the red laser light source, the green laser light source, or the blue laser light source.

As with the first color laser display, the excitation solid laser unit of the second color laser display may emit laser light of wavelength 600 to 660 nm by a transition of $^3P_0 \rightarrow {}^3F_2$ or $^3P_0 \rightarrow {}^3H_6$, and this laser unit can be satisfactorily employed as the red laser light source. In addition, the excitation solid laser unit of the second color laser display may emit laser light of wavelength 515 to 555 nm by a transition of $^3P_1 \rightarrow {}^3H_5$, and this laser unit can be satisfactorily employed as the green laser light source. Furthermore, the excitation solid laser unit of the second color laser display may emit laser light of wavelength 465 to 495 nm by a transition of $^3P_0 \rightarrow {}^3H_4$, and this laser unit can be satisfactorily employed as the blue laser light source.

In accordance with still another important aspect of the present invention, there is provided a third color laser display comprising:

a red laser light source for emitting red laser light;

a green laser light source for emitting green laser light;

a blue laser light source for emitting blue laser light;

modulation means for modulating the red laser light, the green laser light, and the blue laser light, based on a red image signal, a green image signal, and a blue image signal;

a screen for displaying red, green, and blue when irradiated with the red laser light, the green laser light, and the blue laser light; and projection means for projecting the red laser light, the green laser light, and the blue laser light onto the screen so that an image, carrying the red, green, and blue image signals, is displayed on the screen;

wherein a semiconductor laser unit is employed as at least one of the red laser light source, the green laser light source, or the blue laser light source, and the semiconductor laser unit includes an excitation light source constructed of a semiconductor laser element employing a GaN semiconductor in its active layer, and also includes a surface-emitting semiconductor element for emitting laser light when excited with the excitation light source.

In a preferred form of the third color laser display, the surface-emitting semiconductor element of the semiconductor laser unit has an active layer composed of InGaAlP or InGaP, the semiconductor laser unit being employed as the red laser light source. The surface-emitting semiconductor element of the semiconductor laser unit may have an active layer composed of InGaN. In this case, the semiconductor laser unit is employed as the green laser light source and/or the blue laser light source. Moreover, it is preferable that the surface-emitting semiconductor element of the semiconductor laser unit have an active layer composed of GaN, GaNAs, or InGaNAs.

Furthermore, it is desirable that the semiconductor laser element (for the excitation light source) of the semiconductor laser unit of the third color laser display have an active layer composed of InGaN, GaNAs, or InGaNAs. It is also desirable that the semiconductor laser element of the semiconductor laser unit have a stripe width of 5 μm or more.

In the color laser display of the present invention, an excitation solid laser unit with a $Pr^{3+}$-doped solid-state laser crystal, or a fiber laser unit with a fiber having a $Pr^{3+}$-doped core, or a semiconductor laser unit with a GaN semiconductor laser element for exciting a surface-emitting semiconductor element, is employed as a red laser light source, a green laser light source, or a blue laser light source. The red laser light, the green laser light, and the blue laser light, emitted from the light sources, are modulated based on red, green, and blue image signals and are projected onto the screen. Therefore, an image carrying these image signals can be displayed on the screen. With this construction, the color laser display of the present invention has the following advantages:

(1) The excitation solid laser unit, the fiber laser unit, and the semiconductor laser unit, employed as the red, green, or blue laser light source, do not require a cooling mechanism as does the conventional gas laser unit. Thus, the color laser display of the present invention is capable of sufficiently reducing the size, compared with the aforementioned conventional color laser displays. In addition, the reduction in the number of components results in a reduced cost. Even in comparison with the case of employing the aforementioned excitation SHG solid laser as a light source, the effect of the reduced cost by the reduction in the number of components is obtained because there is no need to employ a longitudinal mode control element, such as an optical wavelength conversion element, an etalon, etc.

(2) The light-to-light efficiency of the aforementioned excitation SHG solid laser unit is typically about 10 to 20%, whereas those of the excitation solid laser unit, fiber laser unit, and semiconductor laser unit of the present invention typically reach about 30 to 50%. Thus, the present invention is also capable of realizing high efficiency, compared with the conventional color laser display that employs the excitation SHG solid laser unit as the light source.

(3) The aforementioned excitation solid laser unit, fiber laser unit, and semiconductor laser unit of the present invention do not employ an optical wavelength conversion element in order to obtain a desired wavelength as does the excitation SHG solid laser unit. As a result, there is no occurrence of noise due to a conflict of longitudinal modes that results from wavelength conversion. Thus, the color laser display of the present invention is capable of suppressing an amount of noise to about less than 1%, for example.

(4) The GaN semiconductor laser element for excitation, employed in the color laser display of the present invention, is able to generate high output because its COD value (i.e., the maximum light output at the time of end-face destruction) is very high compared with other GaAs semiconductor laser elements, etc. This enables the color laser display of the present invention to display a high-brightness image.

(5) Particularly, the fiber laser unit employed in the second color laser display of the present invention is able to generate considerably high output as it does not have the problem of a thermal lens, etc. Thus, the second color laser display is capable of displaying a higher-brightness image.

(6) The color laser display of the present invention has the advantage that it can obtain modulated light by directly modulating the excitation GaN semiconductor laser element.

BRIEF DESCRIPTION OF THE DRAWINGS

The present invention will be described in further detail with reference to the accompanying drawings wherein:

FIG. 4 is a diagrammatic side view of another fiber laser unit employed in the color laser display of FIG. 1;

FIG. 8A is a diagrammatic side view showing the construction of a second or third semiconductor laser unit employed in the color laser display of the second embodiment of the present invention;

FIG. 8B is a diagrammatic side view showing an alternation of the semiconductor laser unit shown in FIG. 8A;

FIG. 10 is a diagrammatic side view showing an excitation solid laser unit employed in the present invention.

DESCRIPTION OF THE PREFERRED EMBODIMENTS

Figure 1:
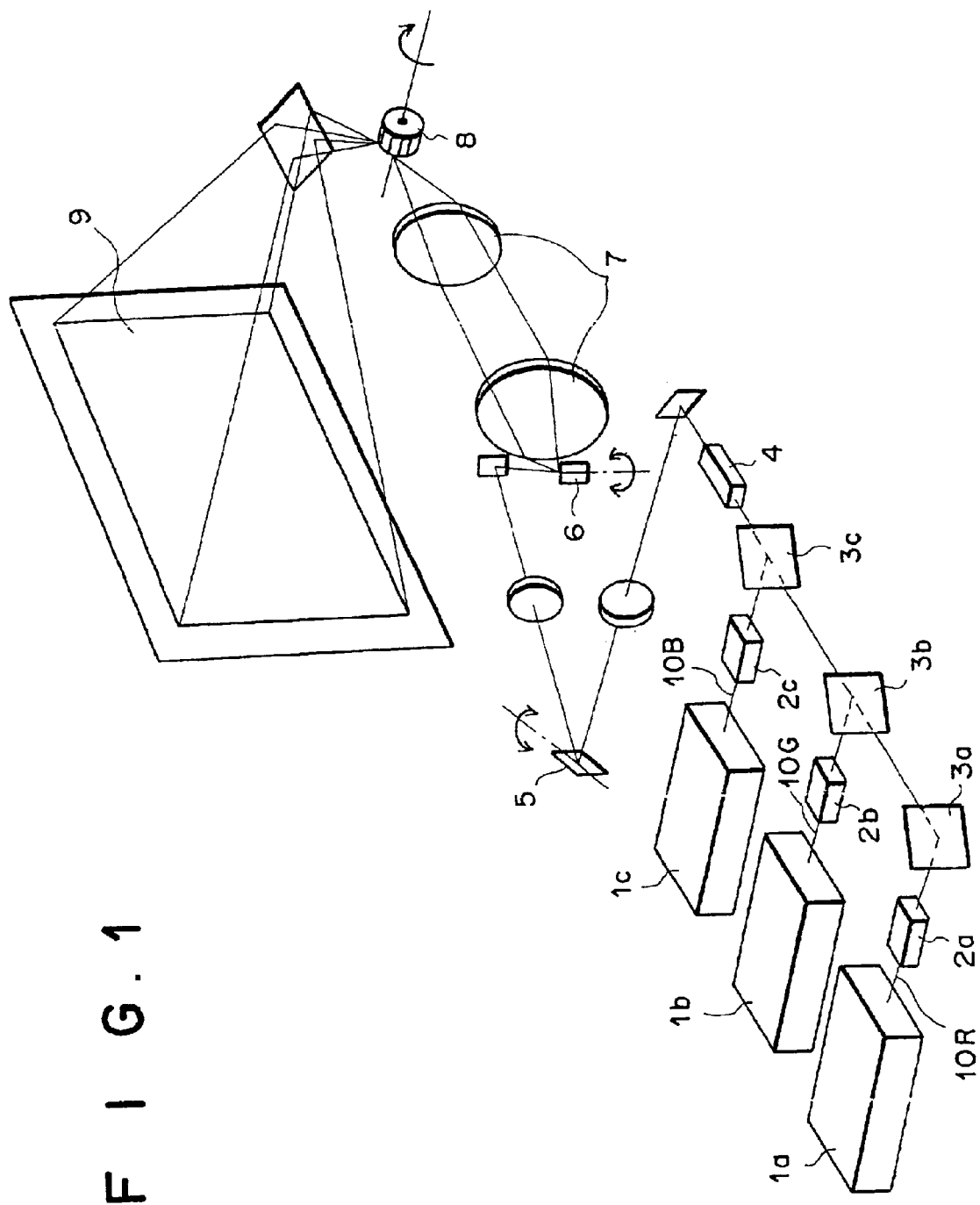
FIG. 1 is a diagrammatic perspective view showing a color laser display constructed according to a first embodiment of the present invention.

Referring more particularly to the drawings which are for the purpose of illustrating preferred embodiments of the present invention only, and not for the purpose of limiting same, FIG. 1 illustrates a color laser display that is a first embodiment of the present invention.

As illustrated in FIG. 1, the color laser display has a red laser light source 1a for emitting red laser light 10R, a green laser light source 1b for emitting green laser light 10G, a blue laser light source 1c for emitting blue laser light 10B, a first optical modulator 2a for modulating the red laser light 10R on the basis of a red image signal, a second optical modulator 2b for modulating the green laser light 10G on the basis of a green image signal, and a third optical modulator 2c for modulating the blue laser light 10B on the basis of a blue image signal.

The modulated red laser light 10R is reflected at a first mirror 3a and transmitted through a second dichroic mirror 3b and a third dichroic mirror 3c. The modulated green laser light 10G is reflected at the second dichroic mirror 3b and transmitted through the third dichroic mirror 3c. The modulated blue laser light 10B is reflected at the third dichroic mirror 3c. In this manner, the modulated red laser light 10R, the modulated green laser light 10G, and the modulated blue laser light 10B are coupled into a single beam of light.

The red laser light 10R, the green laser light 10G, and the blue laser light 10B are transmitted through an electro-optic deflector 4, in which a correction of raster pitch unevenness is made. Then, the red laser light 10R, the green laser light 10G, and the blue laser light 10B are wobbled by a first wobbling galvanometer 5 and are reflected and deflected for vertical scanning by a second galvanometer 6. Next, the red laser light 10R, the green laser light 10G, and the blue laser light 10B are collected by a relay lens 7 and are reflected and deflected for horizontal scanning by a rotating polygon mirror 8.

The red laser light 10R, the green laser light 10G, and the blue laser light 10B, reflected and deflected for vertical scanning and horizontal scanning by the second galvanometer 6 and the rotating polygon mirror 8, are scanned in two dimensions on a screen 9. This screen 9 is formed, for example, from an appropriate substrate coated on the surface with white paint, a diffusing material, etc. The screen 9 diffuses and reflects red light, green light, and blue light, respectively, when irradiated with the red laser light 10R, the green laser light 10G, and the blue laser light 10B.

The red laser light 10R, the green laser light 10G, and the blue laser light 10B having been modulated on the basis of red, green, and blue image signals are scanned two-dimensionally on the screen 9, whereby an image signal carrying the three color signals is projected onto this screen 9. Note that the screen 9 may be of a transmission type.

While the first embodiment has adopted the method of projecting an image onto the screen by scanning the screen two-dimensionally with each color laser light, the present invention may adopt a method in which each color laser light is modulated with a spatial modulation element (e.g., a liquid crystal panel, a digital micromirror device (DMD), grating light value (GLV), etc.) and an image obtained by the modulation is projected onto a screen.

Now, the red laser light source 1a, the green laser light source 1b, and the blue laser light source 1c will be described in detail. In the first embodiment, fiber laser units are employed as these light sources and constructed so that a fiber with a $Pr^{3+}$-doped core is excited with GaN semiconductor laser elements.

Figure 2:
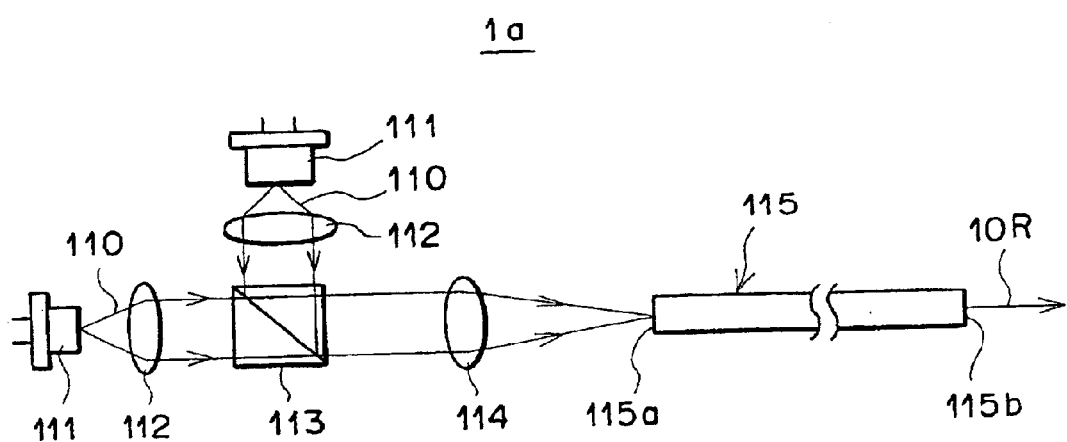
FIG. 2 is a diagrammatic side view of the fiber laser unit employed in the color laser display of FIG. 1.

FIG. 2 illustrates a fiber laser unit used as the red laser light source 1a of the laser light sources 1a, 1b, and 1c. This fiber laser unit comprises two semiconductor laser elements 111 for emitting laser light (excitation light) 110, two collimator lenses 112 for forming the emitted laser light 110 into a collimated beam of laser light, a polarization beam splitter 113 for polarizing and coupling two beams of laser light 110, a collective lens 114 for collecting a single beam of laser light 110 obtained by the polarization beam splitter 113, and a fiber 115 with a $Pr^{3+}$-doped core.

The semiconductor laser element 111 employs a broad area type high-output InGaN semiconductor laser having an oscillating wavelength of 440 nm. The output of each of the semiconductor laser elements 111 in the first embodiment is 2 W and the output of the coupled laser light 110 is thus 4 W.

Figure 3:
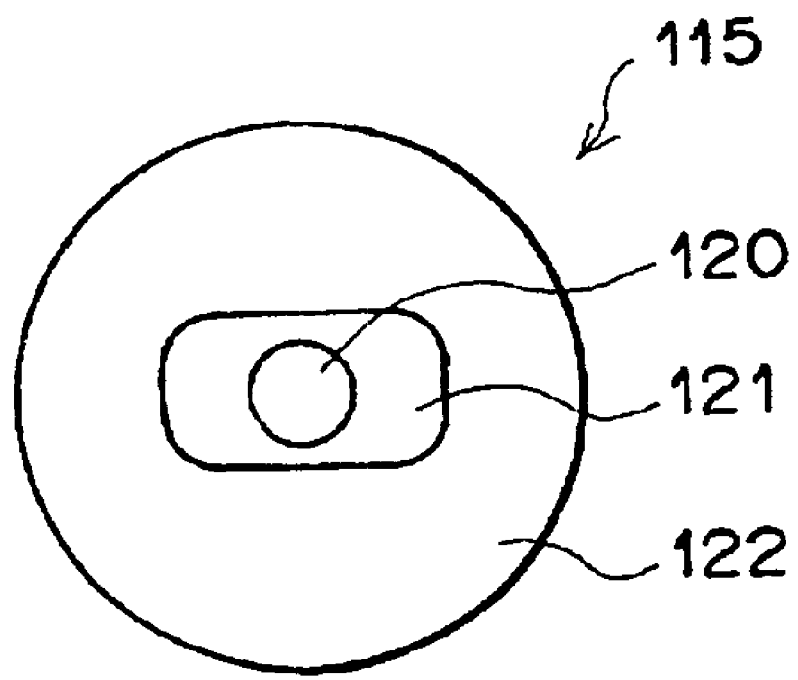
FIG. 3 is a cross sectional view of the fiber employed in the fiber laser unit shown in FIG. 2.

As illustrated in the cross sectional configuration of FIG. 3, the fiber 115 is made up of a circular cross-section core 120, a first rectangular cross-section clad 121 disposed outside the core 120, and a second circular cross-section clad 122 disposed outside the first clad 121. The core 120 is composed of Zr fluoride glass doped, for example, 2% with $Pr^{3+}$ (e.g., $ZrF_4$—$BaF_2$—$LaF_3$—$AlF_3$—$NaF$—$PbF_2$ (ZBLANP)). The first clad 121 is composed of $ZrF_4$—$BaF_2$—$LaF_3$—$AlF_3$—$NaF$ (ZBLAN) by way of example, and the second clad 122 is composed of a polymer by way of example.

Note that the core 120 is not limited to the aforementioned ZBLANP, but may be formed from silica glass, ZBLAN, In/Ga fluoride glass (e.g., ($InF_3$—$GaF_3$—$LaF_3$)—($PbF_3$—$ZnF_2$)—CdF (IGPZCL), etc.), etc.

The laser light 110 of wavelength 440 nm collected by the collective lens 114 is input to the first clad 121 of the fiber 115 and propagates in a waveguide mode along the first clad 121. Thus, the first clad 121 serves as a core for the laser light 110 which is excitation light.

The laser light 110 also passes through the portion of the core 120 while propagating along the core 120. In the core 120, $Pr^{3+}$ is excited by the incident laser light 110 and a transition of $^3P_0 \rightarrow ^3F_3$ causes fluorescence of wavelength 650 nm to occur. This fluorescence also propagates in a waveguide mode along the core 120.

In the ZBLANP core 120, in addition to the transition of $^3P_0 \rightarrow ^3F_3$, a transition of $^3P_1 \rightarrow ^3H_5$ causes fluorescence of wavelength 605 nm to occur, a transition of $^3P_0 \rightarrow ^3F_2$ causes fluorescence of wavelength 605 nm to occur, and a transition of $^3P_0 \rightarrow ^3H_4$ causes fluorescence of wavelength 491 nm to occur.

Hence, the fiber 115 is provided at the light incidence end face 115a thereof with a special coating which becomes highly reflective with respect to fluorescence of wavelength 650 nm and becomes reflectionless with respect to fluorescence of wavelengths 520 nm, 605 nm, and 491 nm and excitation light of wavelength 440 nm and is provided at the light emergence end face 115b with a coating which allows only 1% transmission of fluorescence of wavelength 650 nm.

With these coatings, the aforementioned fluorescence of wavelength 650 nm resonates between both end faces 115a and 115b of the fiber 115 and causes laser oscillation. In this manner, the red laser light 10R with a wavelength of 650 nm occurs and emerges forward from the light emergence end face 115b.

Note that the first embodiment is constructed such that the red laser light 10R propagates in a single mode along the core 120, while the laser light (excitation light) 110 propagates in a multi mode. This construction renders it possible to use the broad area type high-output semiconductor laser element 111 as an excitation light source and input the laser light 110 to the fiber 115 with a high coupling efficiency.

Besides, there is an enhanced possibility that the laser light 110 will propagate along irregular reflection paths within the cross section of the first clad 121 and will be incident on the core 120, because the clad cross section is approximately rectangular.

In this way, high oscillation efficiency is assured and the red laser light 10R with high output is obtained. The output of the red laser light 10R in the first embodiment is 2 W.

Next, a description will be given of the green laser light source 1b. This green laser light source 1b has the same construction as the red laser light source 1a, except that the coatings on both end faces of a fiber differ from those on both end faces of the fiber 115 of the red laser light source 1a in order to transmit the green laser light 10G of wavelength 520 nm. As with the red laser light source 1a, two broad area type high-output InGaN semiconductor lasers with an oscillating wavelength of 440 nm and an output of 2 W are employed as excitation light sources. Therefore, the output of the coupled laser light is 4 W. The output of the green laser light 10G at this time is 1 W.

Next, a description will be made of the blue laser light source 1c. This blue laser light source 1c also has the same construction as the red laser light source 1a, except that the coatings on both end faces of a fiber differ from those on both end faces of the fiber 115 of the red laser light source 1a in order to transmit the blue laser light 10B of wavelength 491 nm. However, the excitation light source in this case employs a combination of two polarization coupling units having an output of 4 W, since blue laser light is low in oscillation efficiency. As with the aforementioned case, each coupling unit includes two broad area type high-output InGaN semiconductors having an oscillating wavelength of 440 nm and an output of 2 W. In this manner, excitation light with an output of 8 W is obtained.

FIG. 4 illustrates the construction of the two polarization coupling units combined together. As illustrated in the figure, the two polarization coupling units 130 are coupled with the Y-shaped branch portions of a fiber 131. The laser light 110 emerging from the fiber 131 is collimated by a collimator lens 132. Next, the collimated laser light 110 is collected by a collective lens 133 and input to a fiber 115.

Note that in the case where the fiber laser units are employed as in the first embodiment, the red laser light 10R, the green laser light 10G, and the blue laser light 10B, emitted from the fiber laser units, are in a longitudinal multi mode. Therefore, the wobbling galvanometer 5 shown in FIG. 1 may be omitted according to circumstances. In addition, a surface-tilt correction optics system employing cylindrical lenses may be employed instead of the electro-optic deflector 4 which performs a correction of pitch unevenness. Furthermore, the optical modulators 2a, 2b, and 2c can be replaced, for example, with acousto-optic modulators (AOMs) or electro-optic modulators (EOMs).

Now, a color laser display according to a second embodiment of the present invention will be described in detail. The color laser display of the second embodiment is differentiated from that of the first embodiment in that instead of the fiber laser units (i.e., the laser light sources 1a, 1b, and 1c), semiconductor laser units with surface-emitting semiconductor elements which are excited by semiconductor laser elements are employed as red, green, and blue light sources.

Figure 5:
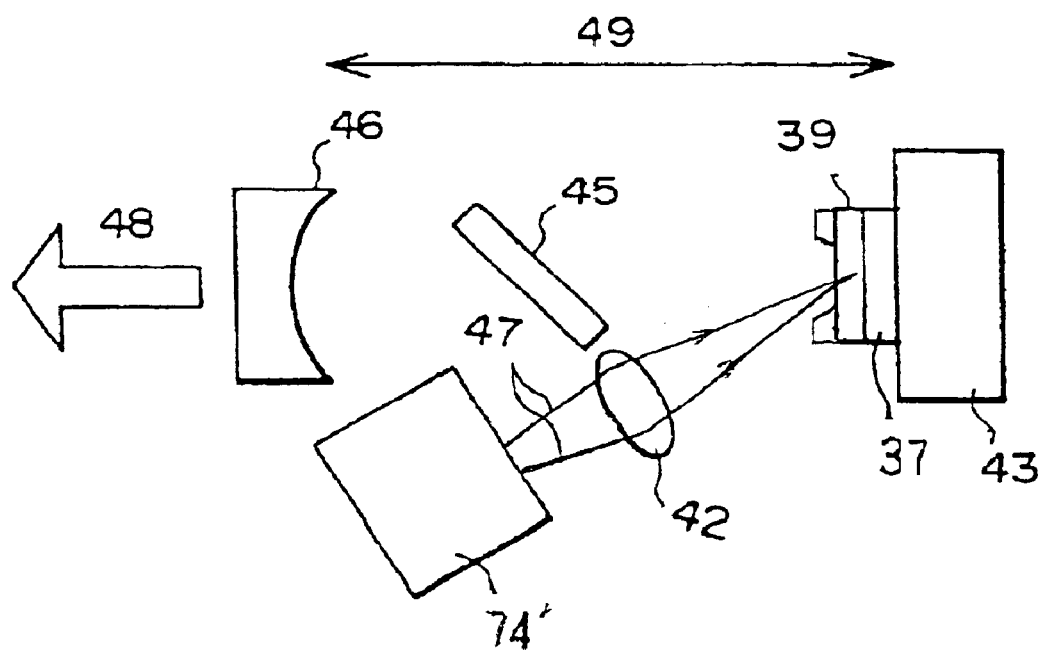
FIG. 5 is a diagrammatic side view showing the construction of a first semiconductor laser unit employed in a color laser display of a second embodiment of the present invention.
Figure 6:
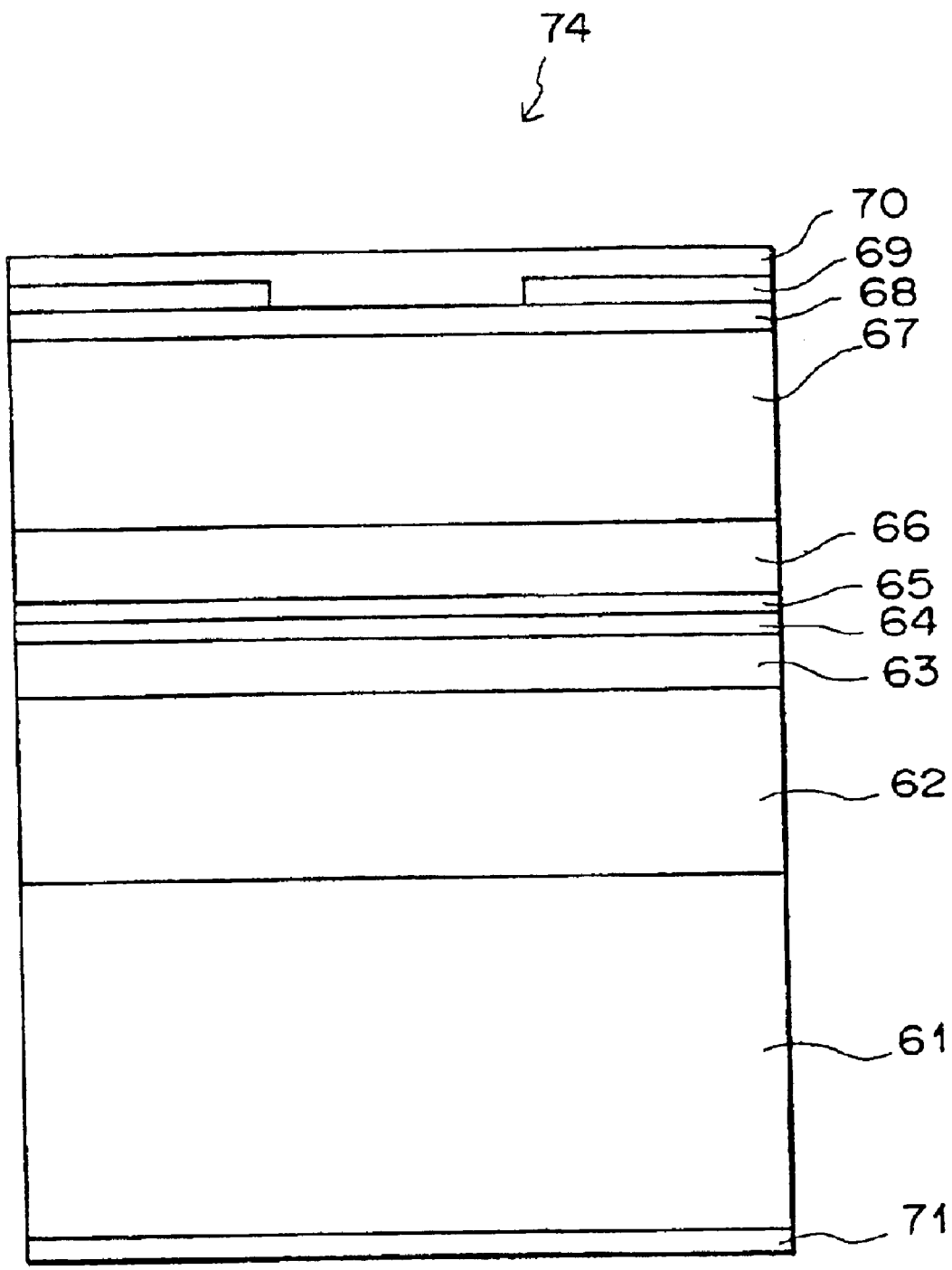
FIG. 6 is a diagrammatic sectional view of a semiconductor laser element constituting the semiconductor laser unit of FIG. 5.
Figure 7:
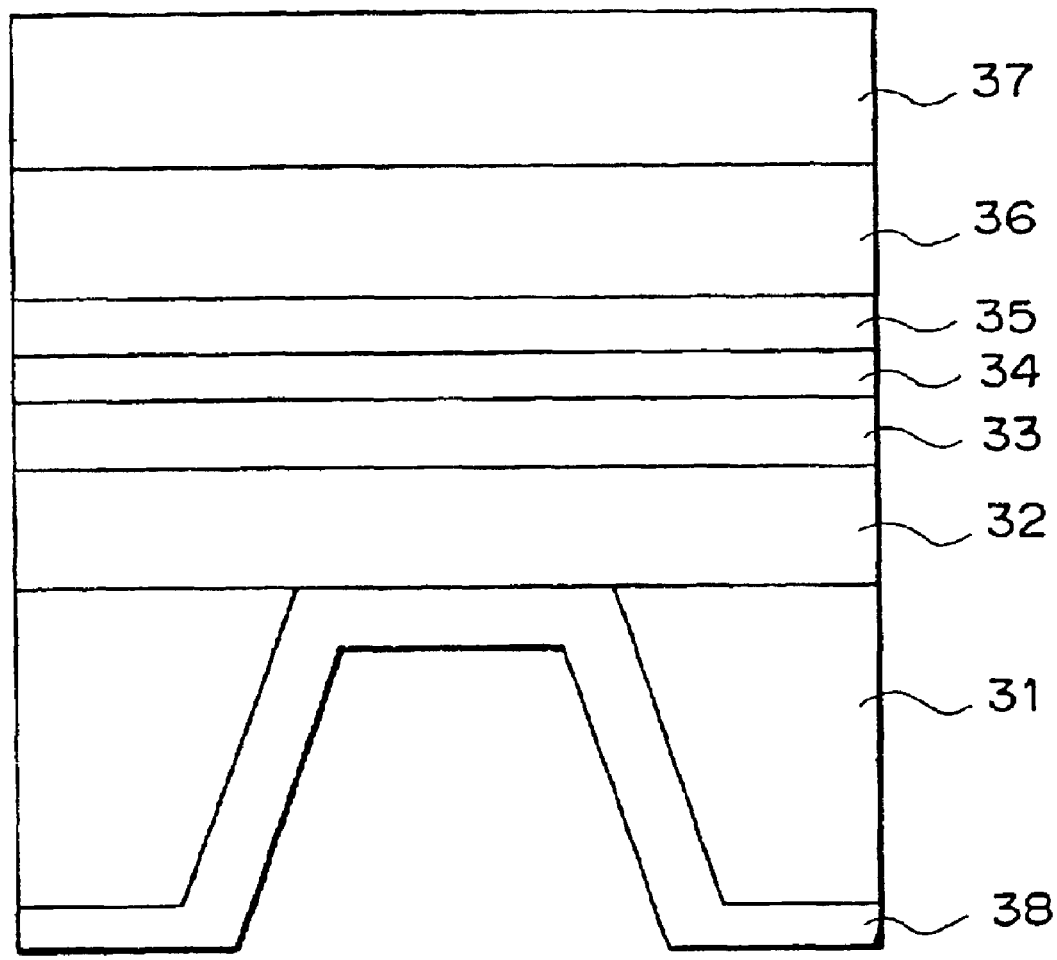
FIG. 7 is a diagrammatic sectional view of a surface-emitting semiconductor laser element constituting the semiconductor laser unit of FIG. 5.

Of the three semiconductor lasers, the first semiconductor laser unit as the red laser light source will be described with reference to FIGS. 5, 6, and 7. FIG. 5 shows the construction of the first semiconductor laser unit. FIGS. 6 and 7 show the semiconductor laser element 74 and surface-emitting semiconductor element 39 of the first semiconductor laser unit, respectively.

Initially, the method of fabricating the semiconductor laser element 74 for excitation will be described with reference to FIG. 6. An n-$Ga_{1-z1}Al_{z1}N$/GaN superlattice cladding layer 62 ($0<z1<1$), an n- or i-GaN waveguide layer 63, an $In_{1-z2}Ga_{z2}N$ (doped with Si)/$In_{1-z3}Ga_{z3}N$ multiple-quantum-well active layer 64 ($0<z2<z3<0.5$), a p-$Ga_{1-z5}Al_{z5}N$ carrier blocking layer 65 ($0<z5<0.5$), an n- or i-GaN waveguide layer 66, a p-$Ga_{1-z1}Al_{z1}N$/GaN superlattice cladding layer 67 ($0<z1<1$) and a p-GaN contact layer 68, are formed on an n-GaN (0001) substrate 61 by organometallic vapor phase epitaxy. Then, a $SiO_2$ insulating film 69 is formed on the p-GaN contact layer 68, and a striped area of the insulating film 69 having a width of about 100 $\mu$m is removed by normal lithography so that the p-GaN contact layer 68 is exposed. Next, a p-side electrode 70 is formed on the insulating film 69 and the exposed portion of the p-GaN contact layer 68. Thereafter, the substrate 61 is polished and an n-side electrode 71 is formed on the polished surface of the substrate 61. A laser resonator is formed by cleavage and provided with a high reflective coating and a low reflective coating. The coated structure is cleaved parallel to the paper surface, whereby the semiconductor laser element 74 is fabricated. The oscillating wavelength of this broad area type InGaN semiconductor laser element 74 is 410 nm and the output is 2 W.

Next, the method of fabricating the surface-emitting semiconductor element 39 will be described with reference to FIG. 7. Notice that λ to be described later is the wavelength of light which the surface-emitting semiconductor element 39 emits when excited with excitation light and that $n_{InAlP}$, $n_{InGaAlP}$, $n_{SiO2}$, and $n_{ZrO2}$ are refractive indices for InAlP, InGaAlP, $SiO_2$, and $ZrO_2$ at the wavelength λ, respectively.

Initially, an $In_{0.5}(Ga_{1-x5}Al_{x5})_{0.5}P$ cladding layer 32, an $In_{0.5}(Ga_{1-x2}Al_{x2})_{0.5}P$ lower confining layer 33, an $In_{0.5}(Ga_{1-x3}Al_{x3})_{0.5}P$/$In_{0.5}(Ga_{1-x4}Al_{x4})_{0.5}P$ multiple-quantum-well active layer 34, an $In_{0.5}(Ga_{1-x2}Al_{x2})_{0.5}P$ upper confining layer 35, and an $In_{0.5}Al_{0.5}P$/$In_{0.5}(Ga_{1-x1}Al_{x1})_{0.5}P$ distributed reflection film 36, are formed on a GaAs substrate 31. It is desirable that the aforementioned composition meet $0 \leq x4 < x3 \leq 1$, $x4 < x2 < x5 \leq 1$, $0 \leq x3 < x1 \leq x2$, and $x3 < x5 < 1$. Also, the distributed reflection film 36 is comprised of two pairs of $In_{0.5}Al_{0.5}P$ and $In_{0.5}(Ga_{1-x1}Al_{x1})_{0.5}P$ layers. The $In_{0.5}Al_{0.5}P$ layer in each pair has a thickness of $\lambda/4n_{InAlP}$, and the $In_{0.5}(Ga_{1-x1}Al_{x1})_{0.5}P$ layer in each pair has a thickness of $\lambda/4n_{InGaAlP}$. Furthermore, the distributed reflection film 36 can be omitted.

Thereafter, a $SiO_2/ZrO_2$ distributed reflection film 37 is formed on the $In_{0.5}Al_{0.5}P/In_{0.5}(Ga_{1-x1}Al_{x1})_{0.5}P$ distributed reflection film 36 by electron beam evaporation, etc. The $SiO_2/ZrO_2$ distributed reflection film 37 is comprised of 12 pairs of $SiO_2$ and $ZrO_2$ layers. The $SiO_2$ layer in each pair has a thickness of $\lambda/4n_{SiO2}$, and the $ZrO_2$ layer in each pair has a thickness of $\lambda/4n_{ZrO2}$. Next, the GaAs substrate 31 is polished with a $H_2SO_4$-system etchant, whereby a light-emitting portion of the GaAs substrate 31 is removed. The etching automatically stops when the $In_{0.5}(Ga_{1-x5}Al_{x5})_{0.5}P$ cladding layer 32 is exposed. Next, a $ZrO_2$ antireflection coating 38 with a thickness of $\lambda/4n_{ZrO2}$ is provided on the GaAs substrate 31. Finally, the structure layered as above is cleaved parallel to the paper surface, whereby the surface-emitting semiconductor element 39 is fabricated.

The wavelength λ of light emitted by the aforementioned surface-emitting semiconductor element 39 can be controlled in a range between 600 and 700 nm by the $In_{0.5}(Ga_{1-x4}Al_{x4})_{0.5}P$ multiple-quantum-well active layer, and in the second embodiment, the wavelength λ is 650 nm.

FIG. 5 shows the first semiconductor laser unit (for the red laser light source 10R) of the second embodiment of the present invention which employs the aforementioned surface-emitting semiconductor element 39 and InGaN semiconductor laser element 74. This semiconductor laser unit includes an excitation light source 74'; the aforementioned surface-emitting semiconductor element 39 with the aforementioned distributed reflection film 37 bonded to a heat sink 43; a concave mirror 46 which is an output mirror; an external laser resonator 49 constructed of the concave surface of the concave mirror 46 and the distributed reflection film 37 of the surface-emitting semiconductor element 39; and a Brewster plate 45, disposed within the external laser resonator 49, for controlling polarization. The excitation light source 74' is equipped with two broad area type InGaN semiconductor laser elements 74 having an output of 2 W, and polarization coupling means, such as that shown in FIG. 2, for coupling the excitation laser light beams emitted from the two semiconductor laser elements 74. The output of the excitation light source 74' is thus 4 W.

The excitation light 47 of wavelength 410 nm emitted from the excitation light source 74' is collected into the semiconductor layers of the surface-emitting semiconductor element 39 by a lens 42 and excites the surface-emitting semiconductor element 39. The light emitted from the excited surface-emitting semiconductor element 39 resonates in the external laser resonator 49, and red laser light 48 of wavelength 650 nm emerges from the output mirror 46. The output of the red laser light 48 is 2 W, and as in the first embodiment, it is utilized for scanning the screen 9 two-dimensionally (refer to FIG. 1).

Note that since the GaAs substrate 31 of the surface-emitting semiconductor element 39 is not transparent to the excitation light 47 of wavelength 410 nm, the surface-emitting semiconductor element 39 is excited at the side face thereof, as illustrated in FIG. 5. The second embodiment modulates the semiconductor laser elements 74 of the excitation light source 74' directly, thereby eliminating the external optical modulator 2a employed in the first embodiment. This results in cost reduction.

Figure 9:
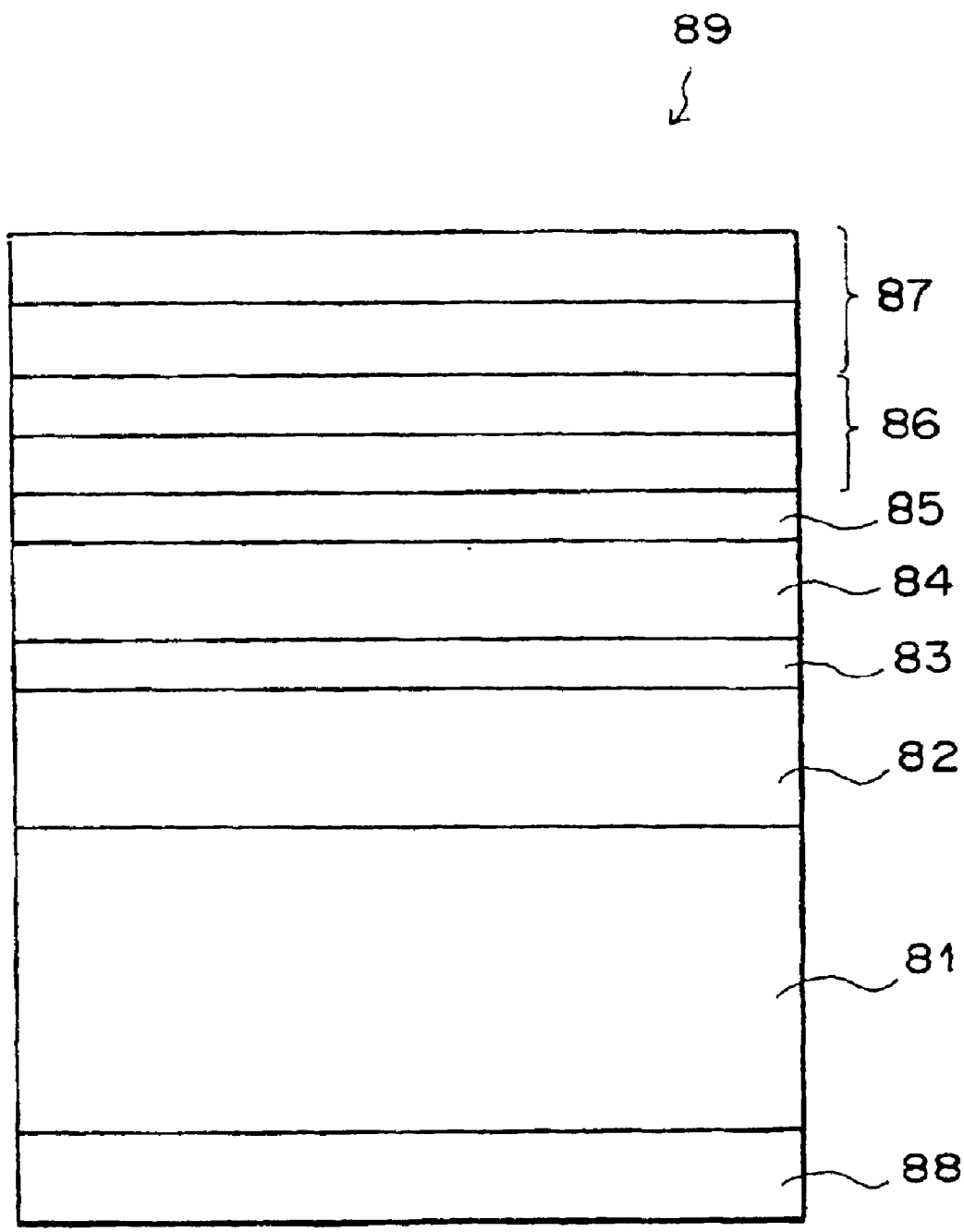
FIG. 9 is a diagrammatic sectional view of a surface-emitting semiconductor laser element constituting the semiconductor laser unit of FIG. 8.

Next, the second and third semiconductor laser units, which are employed as the green and blue laser light sources, will be described with reference to FIGS. 8 and 9. FIGS. 8A and 8B show the second or third semiconductor laser unit and an alternation of the semiconductor laser unit, respectively. FIG. 9 shows the cross section of a surface-emitting semiconductor element 89 employed in each of the second and third semiconductor laser units. The excitation light sources 74' of the second and third semiconductor laser units for exciting the surface-emitting semiconductor element 89 are the same as that employed as the red laser light source 1a of the first semiconductor laser unit. Therefore, they will not be described any further.

Next, the method of fabricating the surface-emitting semiconductor element 89 will be described with reference to FIG. 9. Note that λ to be described later indicates the wavelength of light which the surface-emitting semiconductor element 89 emits when excited with excitation light and that $n_{AlN}$, $n_{GaN}$, $n_{SiO2}$, and $n_{ZrO2}$ indicate the refractive indexes of AlN, GaN, $SiO_2$, and $ZrO_2$ at the wavelength λ, respectively.

As illustrated in FIG. 9, an $Al_{z4}Ga_{1-z4}N$ layer 82 ($0 < z4 < 0.5$), a GaN confining layer 83, an $In_{1-z2}Ga_{z2}N/In_{1-z3}Ga_{z3}N$ multiple-quantum-well active layer 84 ($0 < z2 < z3 < 0.5$), a GaN confining layer 85, and a reflection film 86 consisting of two pairs of AlN (with a thickness of $\lambda/4n_{AlN}$) and GaN (with a thickness of $\lambda/4n_{GaN}$) layers, are formed on a GaN (0001) substrate 81 by organometallic vapor phase epitaxy. Then, a $SiO_2$ (with a thickness of $\lambda/4n_{SiO2}$)/$ZrO_2$ (with a thickness of $\lambda/4n_{ZrO2}$) distributed reflection film 87 is formed on the reflection film 86 by electron beam evaporation, etc. Next, the GaN substrate 81 is polished and provided with a $ZrO_2$ antireflection coating 88 having a thickness of $\lambda/4n_{ZrO2}$. The structure layered as above is cleaved parallel to the paper surface, whereby the surface-emitting semiconductor element 89 is fabricated.

Note that it is desirable that the number of quantum wells in the multiple-quantum-well active layer 84 be 20 pairs or more in order to sufficiently absorb excitation light and further preferable that it be about 24 pairs in order to prevent crack occurrence. The wavelength λ of light emitted by the surface-emitting semiconductor element 89 can be controlled in a range of 380 to 560 nm by the $In_{z3}Ga_{1-z3}N$ multiple-quantum-well active layer, and in the second embodiment, the wavelength λ is 520 nm for the green laser light source 1b and 450 nm for the blue laser light source 1c.

Next, the semiconductor laser unit, constructed of the aforementioned surface-emitting semiconductor element 89 and InGaN semiconductor laser element 74, will be described with reference to FIG. 8. As illustrated in FIG. 8A, the semiconductor laser unit includes an excitation light source 74'; the aforementioned surface-emitting semiconductor element 89 with the aforementioned distributed reflection film 87 bonded to a heat sink 106; a concave mirror 105 which is an output mirror; a laser resonator 109, constructed of the concave surface of the concave mirror 105 and the reflection mirrors 86 and 87 of the surface-emitting semiconductor element 89; and a Brewster plate 104, disposed within the laser resonator 109, for controlling polarization.

The excitation light 107 of wavelength 410 nm, emitted from the excitation light source 74' having an output of 4 W, is collected into the semiconductor layers of the surface-emitting semiconductor element 89 by a lens 102 and excites the surface-emitting semiconductor element 89. The light emitted from the excited surface-emitting semiconductor element 89 resonates in the laser resonator 109, and laser light 108 emerges from the output mirror 105.

In the case of obtaining green laser light of wavelength 520 nm as the laser light 108, the output of the green laser light is 1 W. On the other hand, in the case of obtaining blue laser light of wavelength 450 nm as the laser light 108, the output is 2 W. The green or blue laser light 108, as in the first embodiment, is utilized for scanning the screen 9 two-dimensionally (see FIG. 1).

This case is also capable of eliminating the optical modulators 2b and 2c employed in the first embodiment, by directly modulating the semiconductor laser elements 74 of the excitation light source 74'. This accomplishes cost reduction.

Notice that as illustrated in FIG. 8B, the excitation light source 74' maybe disposed at an angle to the surface-emitting semiconductor element 89 to suppress the light which returns the laser resonator 109 to the excitation light source 74'. In addition, the present invention is not limited to the surface-emitting semiconductor elements described above. For instance, the present invention is also able to employ surface-emitting semiconductor elements that have an active layer consisting of GaN, GaNAs, or InGaNAs. Furthermore, the present invention is not limited to the aforementioned semiconductor laser elements which serve as excitation light sources. For example, the present invention is able to employ other semiconductor laser elements which have an active layer consisting of GaN, GaNAs, or InGaNAs.

FIG. 10 illustrates an excitation solid laser unit that can be employed in the color display of the present invention. This laser unit includes a semiconductor laser element 211 for emitting laser light (excitation light) 210, a collective lens 212 for collecting the emitted laser light 210, and a $LiYF_4$ crystal 213 which is a solid-state laser medium doped with $Pr^{3+}$ (hereinafter referred to as a $Pr^{3+}:LiYF_4$ crystal).

The semiconductor laser element 211, the collective lens 212, and the $Pr^{3+}:LiFY_4$ crystal 213 are mounted on a Peltier element 214. In addition, a thermistor 215 for temperature detection is mounted on the Peltier element 214. An output signal from this thermistor 215 is input to a temperature control circuit (not shown). With this temperature control circuit, the Peltier element 214 is driven based on the output signal from the thermistor 214 so that the semiconductor laser element 211, the collective lens 212, and the $Pr^{3+}:LiFY_4$ crystal 213 are maintained at a predetermined temperature.

The semiconductor laser element 211 employs a broad area type InGaN semiconductor laser element having an oscillating wavelength of 440 nm. The $Pr^{3+}:LiFY_4$ crystal 213 is provided at its light incidence end face or rear end face 213a with a coating (with a reflectance of 99.9% or more) which permits satisfactory reflection of light of wavelength 479 nm, and is provided at its light emergence end face or front end face 213b with a coating which permits only only 1% transmission of light of wavelength 479 nm and reflection of the remaining light.

The laser light 210 with a wavelength of 440 nm, emitted from the InGaN semiconductor laser element 211, is incident on the rear end face 213a of the $Pr^{3+}:LiFY_4$ crystal 213. The $Pr^{3+}$ in the $Pr^{3+}:LiFY_4$ crystal 213 is then excited with the incident laser light 210, and a transition of $^3P_0 \rightarrow ^3H_4$ causes light of wavelength 479 nm to occur. The light of wavelength 479 nm oscillates between the crystal end faces 213a and 213b provided with the aforementioned coatings and causes laser oscillation. The blue laser light 216 of wavelength 479 nm, generated in this manner, emerges from the front end face 213b of the crystal 213.

While the excitation solid laser unit for generating blue laser light has been described, the present invention is also capable of employing other excitation laser units for generating red laser light of wavelength 600 to 660 nm and green laser light of wavelength 515 to 555 nm by taking advantage of a transition of $^3P_0 \rightarrow ^3F_2$ or $^3P_0 \rightarrow ^3H_6$ and a transition of $^3P_1 \rightarrow ^3H_5$.

In addition, although the present invention has been described with reference to the preferred embodiments thereof, the invention is not to be limited to the details given herein, but may be modified within the scope of the invention hereinafter claimed.

What is claimed is:

1. A color laser display comprising:

a red laser light source for emitting red laser light;

a green laser light source for emitting green laser light;

a blue laser light source for emitting blue laser light;

modulation means for modulating said red laser light, said green laser light, and said blue laser light, based on a red image signal, a green image signal, and a blue image signal;

a screen for displaying red, green, and blue when irradiated with said red laser light, said green laser light, and said blue laser light; and projection means for projecting said red laser light, said green laser light, and said blue laser light onto said screen so that an image, carrying said red, green, and blue image signals, is displayed on said screen;

wherein an excitation solid laser unit, having a solid-state laser crystal comprising a $Pr^{3+}:LiFY4$ crystal doped with $Pr^{3+}$ and a GaN semiconductor laser element emitting excitation light at a wavelength of 440 nm for exciting said solid-state laser crystal, is employed as at least one of said red laser light source, said green laser light source, or said blue laser light source.

2. A color laser display according to claim 1, wherein said excitation solid laser unit emits laser light of wavelength 600 to 660 nm by a transition of $^3P_0 \rightarrow ^3F_2$ or $^3P_0 \rightarrow ^3H_6$ and is employed as said red laser light source.

3. A color laser display according to claim 2, wherein said excitation solid laser unit emits laser light of wavelength 515 to 555 nm by a transition of $^3P_1 \rightarrow ^3H_5$ and is employed as said green laser light source.

4. A color laser display according to claim 2, wherein said excitation solid laser unit emits laser light of wavelength 465 to 495 nm by a transition of $^3P_0 \rightarrow ^3H_4$ and is employed as said blue laser light source.

5. A color laser display according to claim 1, wherein said excitation solid laser unit emits laser light of wavelength 515 to 555 nm by a transition of $^3P_1 \rightarrow ^3H_5$ and is employed as said green laser light source.

6. A color laser display according to claim 5, wherein said excitation solid laser unit emits laser light of wavelength 465 to 495 nm by a transition of $^3P_0 \rightarrow ^3H_4$ and is employed as said blue laser light source.

7. A color laser display according to claim 1, wherein said excitation solid laser unit emits laser light of wavelength 465 to 495 nm by a transition of $^3P_0 \rightarrow ^3H_4$ and is employed as said blue laser light source.

8. A color laser display comprising:

a red laser light source for emitting red laser light;

a green laser light source for emitting green laser light;

a blue laser light source for emitting blue laser light;

modulation means for modulating said red laser light, said green laser light, and said blue laser light, based on a red image signal, a green image signal, and a blue image signal;

a screen for displaying red, green, and blue when irradiated with said red laser light, said green laser light, and said blue laser light; and projection means for projecting said red laser light, said green laser light, and said blue laser light onto said screen so that an image, carrying said red, green, and blue image signals, is displayed on said screen;

wherein a fiber laser unit, having a fiber that is one of Zr fluoride glass-doped fiber and an In/Ga fluoride glass fiber, with a $Pr^{3+}$-doped core and a GaN semiconductor laser element emitting excitation light at a wavelength of 440 nm for exciting said fiber, is employed as at least one of said red laser light source, said green laser light source, or said blue laser light source.

9. A color laser display according to claim 8, wherein said fiber laser unit emits laser light of wavelength 600 to 660 nm by a transition of $^3P_0 \rightarrow {}^3F_2$ or $^3P_0 \rightarrow {}^3H_6$ and is employed as said red laser light source.

10. A color laser display according to claim 9, wherein said fiber laser unit emits laser light of wavelength 515 to 555 nm by a transition of $^3P_1 \rightarrow {}^3H_5$ and is employed as said green laser light source.

11. A color laser display according to claim 9, wherein said fiber laser unit emits laser light of wavelength 465 to 495 nm by a transition of $^3P_0 \rightarrow {}^3H_4$ and is employed as said blue laser light source.

12. A color laser display according to claim 8, wherein said fiber laser unit emits laser light of wavelength 515 to 555 nm by a transition of $^3P_1 \rightarrow {}^3H_5$ and is employed as said green laser light source.

13. A color laser display according to claim 12, wherein said fiber laser unit emits laser light of wavelength 465 to 495 nm by a transition of $^3P_0 \rightarrow {}^3H_4$ and is employed as said blue laser light source.

14. A color laser display according to claim 8, wherein said fiber laser unit emits laser light of wavelength 465 to 495 nm by a transition of $^3P_0 \rightarrow {}^3H_4$ and is employed as said blue laser light source.

* * * * *